United States Patent
Anderson et al.

(10) Patent No.: US 7,196,880 B1
(45) Date of Patent: Mar. 27, 2007

(54) SPIN VALVE SENSOR HAVING A NONMAGNETIC ENHANCEMENT LAYER ADJACENT AN ULTRA THIN FREE LAYER

(75) Inventors: Geoff Anderson, Pleasanton, CA (US); Yiming Huai, Pleasanton, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 0 days.

(21) Appl. No.: 10/011,197

(22) Filed: Nov. 8, 2001

Related U.S. Application Data

(63) Continuation of application No. 09/356,617, filed on Jul. 19, 1999, now abandoned.

(51) Int. Cl.
*G11B 5/39* (2006.01)
(52) U.S. Cl. ................................. 360/324.12
(58) Field of Classification Search ........... 360/324.12, 360/324.1, 314
See application file for complete search history.

(56) References Cited

U.S. PATENT DOCUMENTS

| | | | |
|---|---|---|---|
| 5,408,377 A | 4/1995 | Gurney et al. | |
| 5,422,571 A | 6/1995 | Gurney et al. | |
| 5,549,978 A | 8/1996 | Iwasaki et al. | |
| 5,574,605 A | 11/1996 | Baumgart et al. | |
| 5,701,222 A | 12/1997 | Gill et al. | |
| 5,796,561 A | 8/1998 | Mauri | |
| 5,849,422 A | 12/1998 | Hayashi | |
| 5,850,323 A * | 12/1998 | Kanai ..................... | 360/324.11 |
| 5,991,125 A | 11/1999 | Iwasaki et al. | |
| 6,052,262 A | 4/2000 | Kamiguchi et al. | |
| 6,087,027 A | 7/2000 | Hoshiya et al. | |
| 6,090,480 A | 7/2000 | Hayashi | |
| 6,093,444 A | 7/2000 | Miyauchi et al. | |
| 6,141,191 A * | 10/2000 | Lee et al. ................ | 360/324.1 |
| 6,178,074 B1 | 1/2001 | Gill | |
| 6,181,534 B1 | 1/2001 | Gill | |
| 6,208,492 B1 | 3/2001 | Pinarbasi | |
| 6,219,208 B1 | 4/2001 | Gill | |
| 6,222,707 B1 | 4/2001 | Huai et al. | |
| 6,338,899 B1 * | 1/2002 | Fukuzawa et al. .......... | 428/332 |
| 6,687,098 B1 * | 2/2004 | Huai ..................... | 360/324.12 |

OTHER PUBLICATIONS

Speriousu, V.S., Gurney, B.A., Wilhoit, D.R. and Brown, L.B. "Spin Valves with Synthetic Ferrimagnets," IBM Research Division, San Jose, California, Jul. 1996, p. AA-04.

* cited by examiner

*Primary Examiner*—Craig A. Renner
(74) *Attorney, Agent, or Firm*—Jonathan E. Prejean, Esq.; Haynes Beffel & Wolfel

(57) ABSTRACT

A spin valve device includes a non-magnetic enhancement layer adjacent an ultra thin free layer. The thickness of the free layer may be less than the mean free path of a conduction electron through the free layer. The GMR ratio is significantly improved for free layer thicknesses below 50 Å. The enhancement layer allows electrons to travel longer in their spin state before encountering scattering sites. The electronic properties of the enhancement layer material can be matched with the adjacent free layer without creating a low resistance shunt path. Because the free layer may be made ultra thin and the enhancement layer is formed of a nonmagnetic material, less magnetic field is required to align the free layer, allowing for improved data density. Also, the enhancement layer allows for effective bias point control by shifting sensor current density distribution.

16 Claims, 6 Drawing Sheets

SPIN VALVE SENSOR HAVING A NONMAGNETIC ENHANCEMENT LAYER ADJACENT AN ULTRA THIN FREE LAYER

This application is a CON of Ser. No. 09/356,617 Jul. 19, 1999 ABN

BACKGROUND OF THE INVENTION

1. Technical Field

The present invention relates to the field of spin-valve sensors.

2. Background Art

Data is stored on magnetic media by writing on the magnetic media using a write head. Magnetic media may be formed in any number of ways, such as tape, diskette, hard disk, or the like. Writing involves storing a data bit by utilizing magnetic flux to set the magnetic moment of a particular area on the magnetic media. The state of the magnetic moment is later read, using a read head, to retrieve the stored information.

Data density is determined by the amount of data stored on an area of magnetic media and depends on how much area must be allocated to each bit. To decrease bit size, head size is decreased by fabricating thin film read and write heads. Thin film heads commonly employ separate write and read heads.

One type read head employs a spin valve sensor. Spin valve sensors exploit changes in electrical resistance which occur as a result of manipulating the relative orientation of the magnetization of ferromagnetic layers within the spin valve sensor.

In conventional spin valve sensors, one ferromagnetic layer has its magnetization pinned while another, which has its magnetization set perpendicular to the pinned player, is free to change its magnetic orientation in response to magnetized bits on adjacent recording media. Thus, the magnetized bits on the recording media change the relative magnetization between the pinned layer and the free layer so that the sensor presents a high resistance state when the magnetizations are antiparallel and a low resistance state when the magnetizations are parallel. An induced current through the spin valve is used to detect changes in the resistance of the spin valve that results from changes in the relative magnetizations of the pinned and free layers.

As data bits are made smaller to increase data density, the magnetic field generated by the smaller bits becomes weaker. As such, there is less magnetic field to rotate the free layer. As a result, the free layer must be made thinner so it can respond to the weaker magnetic fields.

One result of reducing the thickness of the free layer, however, is that it also reduces the performance of the spin valve. Reducing the thickness of the free layer decreases the giant magnetoresistance of the spin valve. As the thickness of the free layer becomes ever smaller, the giant magnetoresistance decreases more significantly. In addition, decreasing the thickness of the free layer can also increase the magnetic hardness and the sheet resistance of the spin valve. Thus, in conventional spin valves, spin valve performance, and ultimately data density, is limited by free layer thickness.

SUMMARY

The preferred embodiment of the present invention provides a spin valve device having a non-magnetic enhancement layer adjacent to a free layer. The enhancement layer of the preferred embodiment allows the free layer to be formed ultra thin so that the thickness of the free layer is less than the mean free path of conduction electrons through the free layer. In a typical embodiment, this allows the thickness of the free layer to be reduced to below about 50 Angstroms without the reduction in GMR effect normally associated with such thicknesses. In addition, the introduction of the enhancement layer provides for effective bias point control in spin valve sensor design by shifting the sensor current density distribution.

In the preferred embodiment, the enhancement layer provides an improved conduction path for electrons as the thickness of the free layer is made ultra thin. With the preferred embodiment, the material of the enhancement layer is selected so that its electronic properties are reasonably matched with the adjacent free layer to allow electrons to continue conducting through the enhancement layer. It is preferred to select a material with sufficiently low resistance to allow more electrons to travel in their spin state before they encounter scattering sites while not creating a low resistance shunt path which competes with GMR gains derived from the improved conduction path length. It is also preferred to select the material of the enhancement layer so that it provides the desired electrostatic discharge, current flow, heating, or other properties. Moreover, material selection also is dependent on enhancement layer thickness because the amount of improvement in GMR ratio is dependent on material type and thickness. As such, different embodiments of the present invention may employ different materials for the enhancement layer to improve GMR effect in ultra thin free layer spin valves.

The enhancement layer of the present invention may employ several different types of non-magnetic materials to improve GMR effect. In a presently preferred embodiment, Cu is used as the enhancement layer material. In addition to improving the GMR, the Cu enhancement layer provides low sheet resistance, and also provides favorable thermal stability and magnetostriction properties with an adjacent CoFe free layer.

In another embodiment NiFeCr is used as the enhancement layer material. In addition to improving the GMR, the NiFeCr enhancement layer provides low sheet resistance, and also provides favorable thermal stability and magnetostriction properties with an adjacent NiFe free layer. It also provides a good seed texture, which is particularly desirable in top spin valve embodiments. In another embodiment, in addition to improving the GMR ratio, the NiFeCr enhancement layer adjacent a CoFe free layer also improves the CoFe free layer coercivity.

With the preferred embodiments of the present invention, because the free layer is made ultra thin and the enhancement layer is formed of a non-magnetic material, less magnetic field is required from the magnetic media to align the free layer, thus allowing for improved data density.

DETAILED DESCRIPTION OF THE PREFERRED EMBODIMENTS OF THE INVENTION

Figure 1:
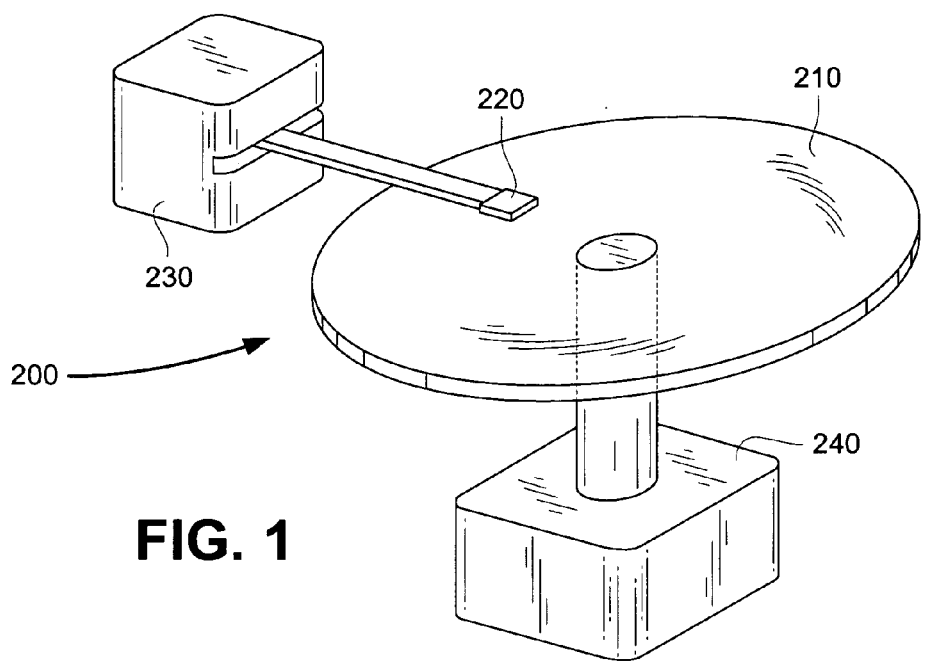
FIG. 1 shows a data storage and retrieval apparatus in accordance with an embodiment of the invention.

FIG. 1 is a conceptual drawing of a possible embodiment of a thin film read head of the present invention. FIG. 1 shows the thin film read head of the present invention embodied in a disk type magnetic data storage and retrieval apparatus 200. The read head of the present invention is located within a merged head assembly 220 which rides above a magnetic storage media 210, depicted in FIG. 1 as a rotatable hard disk type storage media. The hard disk 210 is coupled to a motor 240 to provide rotation of the disk relative to the head assembly 220. An actuating means 230 may be used to position the head assembly 220 above the surface of the media 210 to read and write data in the form of magnetic bits from and to the media 210. The data storage and retrieval apparatus 200, typically has several hard disks 210 and several corresponding head assemblies 220. The improved spin valve of the present invention is intended to be utilized in all known data storage and retrieval apparatuses. By way of non-exclusive example, the spin valve of the present invention also may be embodied in magnetic tape type storage and retrieval apparatuses, or any other known types of magnetic storage and retrieval apparatuses.

Figure 2:
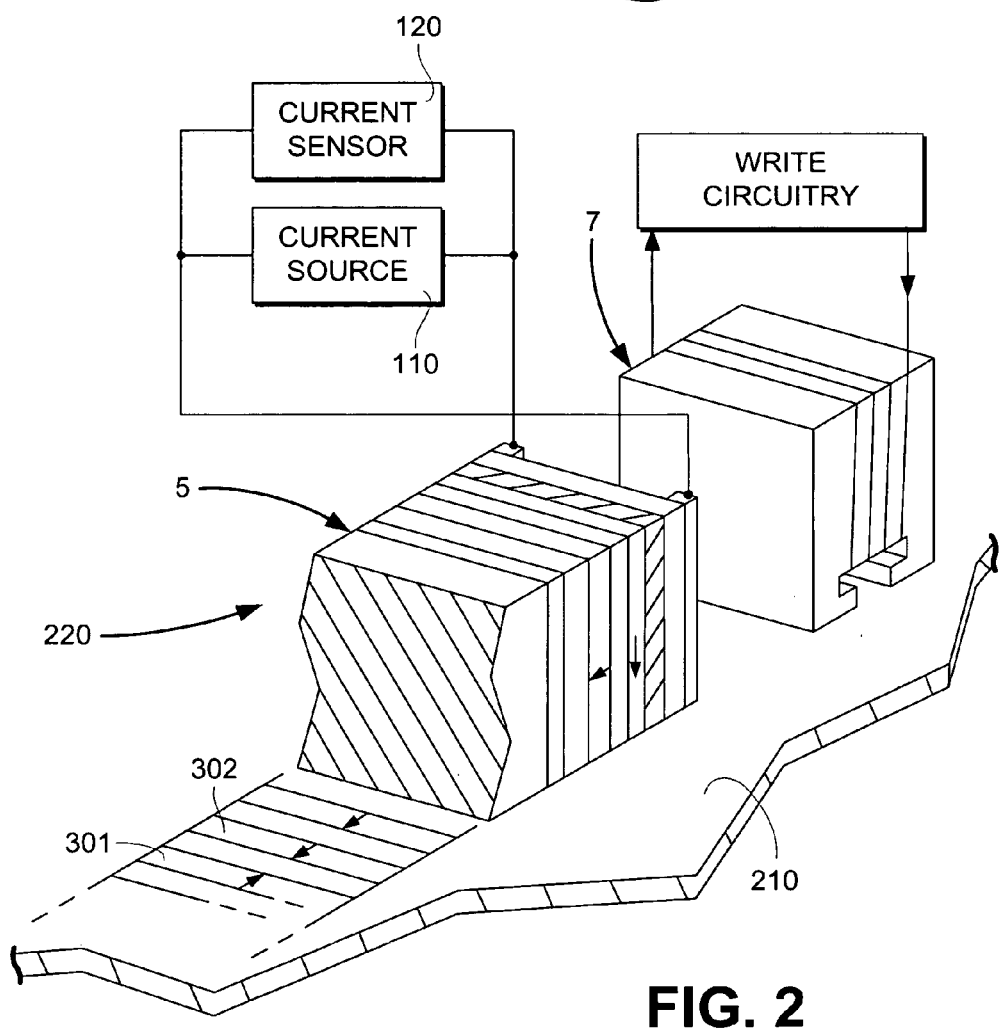
FIG. 2 shows a simplified functional illustration of a head assembly shown in exploded perspective view.

FIG. 2 shows a simplified functional illustration of the head assembly 220. Merged head assemblies 220 are formed having a write head 7, used to write or set the magnetization of bits 301, 302 on the media 210, while a read head 5 coupled to a current source 110 and a current sensor 120, reads the magnetization of those bits 301, 302 from the media 210. The depiction in FIG. 2 is a functional representation of a merged head; the merged head of the present invention may be formed by techniques well known in the art such as by masking, depositing, and etching successive layers to form the conventional structures of the merged head 220.

Figure 3:
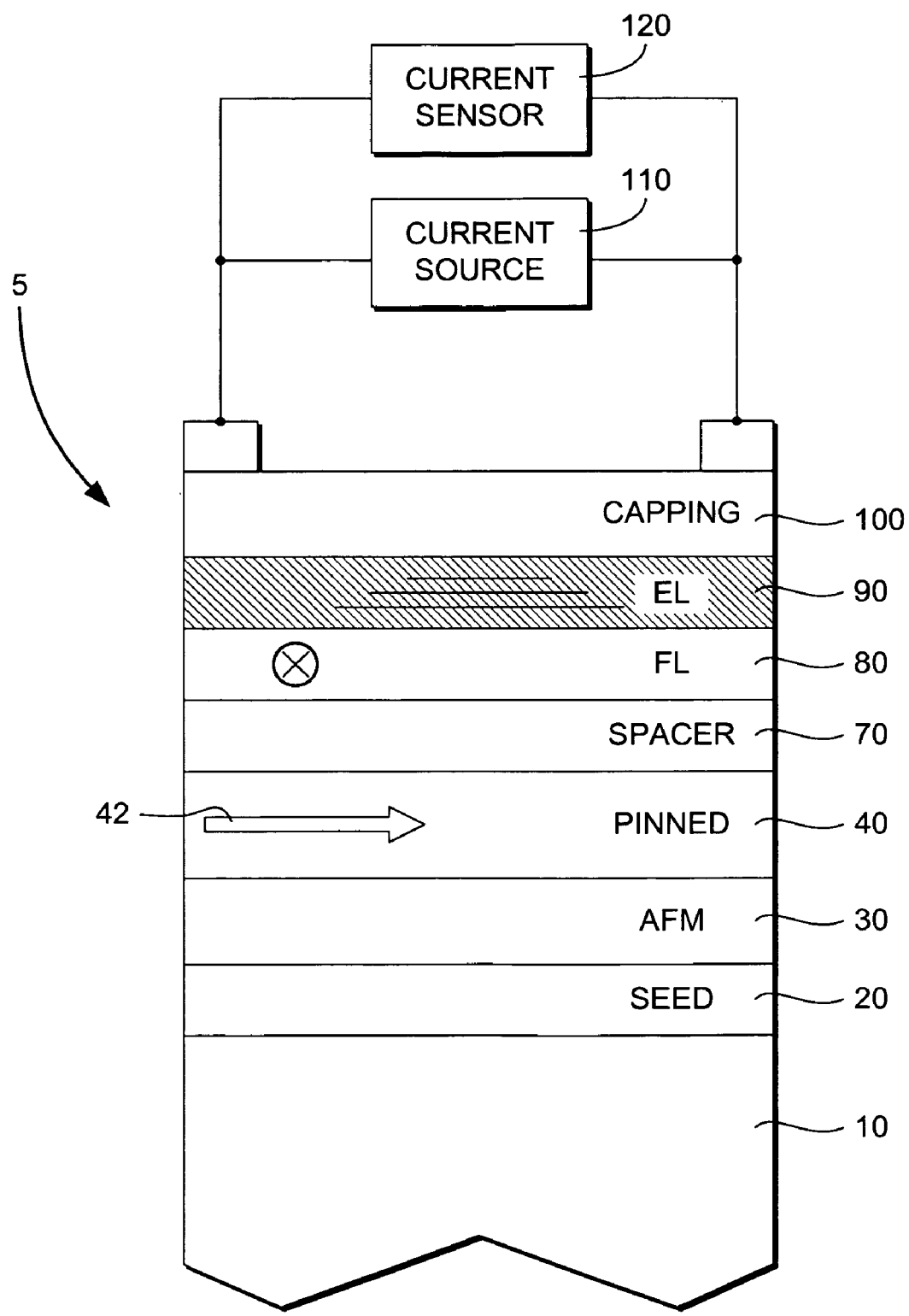
FIG. 3 is a cross-sectional view of the structure of a bottom spin valve in accordance with a preferred embodiment of the present invention.
Figure 4:
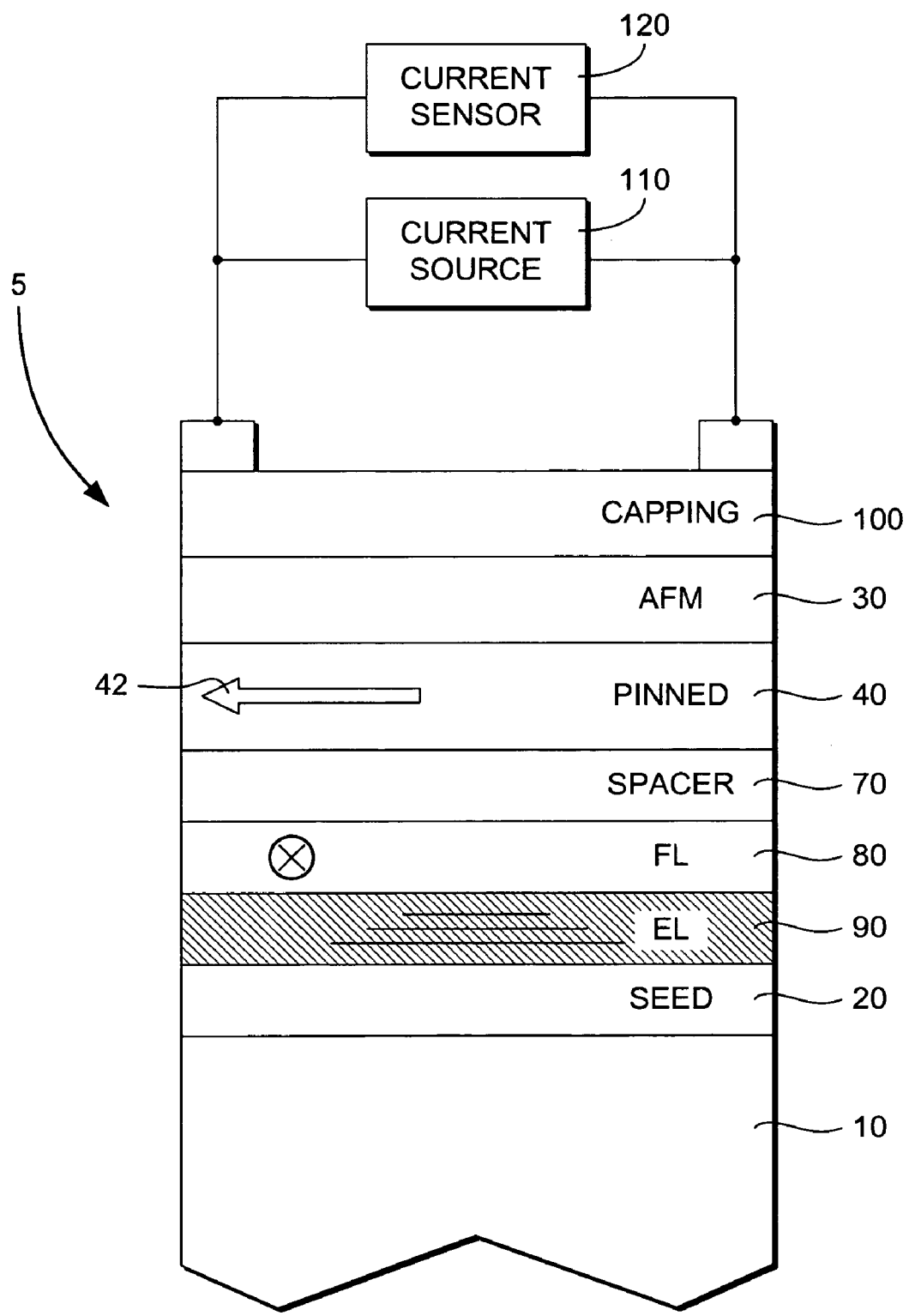
FIG. 4 is a cross-sectional view of the structure of a top spin valve in accordance with a preferred embodiment of the present invention.

FIGS. 3 and 4 show possible structures of the spin valve read sensor 5 of the present invention. The spin valve of the present invention may have a bottom or a top structure as shown in FIGS. 3 and 4 respectively. The structure of the spin valve 5 of the present invention may comprise: a substrate 10; a seed layer 20; a pinning layer 30; a pinned layer 40; a spacer layer 70; a free layer 80, which may comprise two or more layers; an enhancement layer 90; and a capping layer 100. The pinned layer 40 may comprise two ferromagnetic layers separated by a thin non-magnetic spacer.

In a standard spin valve employing a NiFe/CoFe free layer, as the thickness of the free layer 80 is reduced below about 50 Angstroms, there is a significant reduction in GMR ratio the thickness of NiFe is reduced. This occurs as its thickness becomes less than the mean free path λ of the conduction electrons, which may be in a range of about 20 Angstroms to about 80 Angstroms and is usually about 50 Angstroms for typical spin valves.

As the thickness of the free layer 80 is reduced below the mean free path length, an ever increasing amount of electrons are scattered at the free layer 80 boundary with the seed layer 20 in a top spin valve, or with the capping layer 100 in a bottom spin valve, which are both typically formed of Ta. In part, this scattering occurs because the free layer 80 no longer has sufficient thickness to allow electrons to take full advantage of spin valve transport. In an ultra thin free layer, one where the thickness of the free layer 80 becomes less than the mean free path of the electrons through the free layer 80, the boundary of the free layer, for example the free layer/seed layer interface or the free layer/capping layer interface, becomes an artificial scattering boundary, consequently raising its resistance. The electrons that would otherwise continue moving under spin valve transport through the free layer without scattering, hit the interface and scatter as they encounter the free layer boundary and the adjacent high resistance seed layer 20 or capping layer 100. This results in a reduction in the path difference between spin up and down electrons, thus reducing the GMR effect.

It should be noted that with the preferred embodiments, as a result of the reduced thickness of the free layer, the magnetic field required to rotate the free layer is less. Hence, bit size on the media may be reduced. As such, the preferred embodiment decouples GMR ratio from free layer thickness at ultra thin free layer thicknesses, and allows aerial density to improve without the corresponding reduction in the GMR ratio due to an artificially reduced electron mean free path.

In the preferred embodiment, the material of the enhancement layer 90 is selected so that its electronic properties are reasonably matched with the adjacent free layer 80 to allow electrons to continue conducting through the enhancement layer 90. It is preferred to select a material with sufficiently low resistance, in the range of about 1 to 20 microOhm-cm, to allow more electrons to travel in their spin state before they encounter scattering sites.

On the other hand, if the resistivity of the enhancement layer 90 is too small, it may allow too much shunt current through the device and actually lower the GMR ratio. This is dependent in part on the thickness of the enhancement layer, as will be discussed further below. As such, different materials may be used in different embodiments to provide varying degrees of improvement in the GMR ratio.

In addition, other concerns, such as electrostatic discharge during fabrication, current flow, or heating requirements for a particular embodiment may factor into selection of material for enhancement layer 90. As such, medium resistivity material may be more desirable in some embodiments to improve electron mean free path while inhibiting shunt current. In other embodiments, a lower resistivity material may be more desirable to improve electron mean free path while minimizing device heating or reducing electrostatic discharge during fabrication.

Also, it is preferred to use a non-magnetic material for the enhancement layer 90. In such embodiments, because the enhancement layer 90 is non-magnetic, it does not provide extra spin valve effect, but instead allows the electrons to travel along their mean free path without being scattered at the free layer boundary or by the adjacent seed material or capping material. As such, the preferred embodiment provides a path for continued electron movement so that scattering occurs at a distance closer to the mean free path of the electron, thus improving the GMR ratio. As an additional advantage, the presence of the enhancement layer results in a shift of the current density distribution in the sensor, resulting in more effective bias point control.

Furthermore, because the enhancement layer 90 is near the bottom of the spin valve layers in top spin valve embodiments, it is important to select material for enhancement layer 90 so that it provides good seed texture for succeeding layers to improve the performance of the spin valve as disclosed in copending U.S. patent application Ser. No. 09/349,745, filed on Jul. 8, 1999, by Yiming Huai, entitled TOP SPIN VALVE WITH IMPROVED SEED LAYER, issued as U.S. Pat. No. 6,687,098, on Feb. 3, 2004, incorporated herein by reference in its entirety. In bottom spin valve embodiments, it is not important that the enhancement layer also provide good seed texture for the spin valve, as the enhancement layer is near the top of the spin valve structure.

Providing good seed texture is particularly important as the thickness of the free layer 80 is reduced. As the thickness of the free layer is reduced, the texture of the free layer 80 and of the succeeding layers is more dependent on the texture of the layer underlying the free layer 80. In such embodiments, simply providing a good conductor without good seed texture could actually reduce the GMR ratio.

FIGS. 5–8, and Table 1 below, show empirical data for some preferred embodiments. The enhancement layer 90 of the present invention may have different embodiments employing different materials for enhancement layer 90. The selection of materials, in part, will depend upon design and performance parameters for a particular embodiment. Furthermore, enhancement layer 90 material selection also may depend, in part, upon free layer 80 composition as will be discussed further below.

The enhancement layer 90 of the present invention is not limited to a single layer of material. It may comprise more than one layer of materials to form the enhancement layer 90. Thus, several layers may be combined to optimize performance. Selection of material for multi-layer enhancement layer 90 embodiments, in part, will depend upon the design and performance parameters of the particular embodiment.

Figure 5:
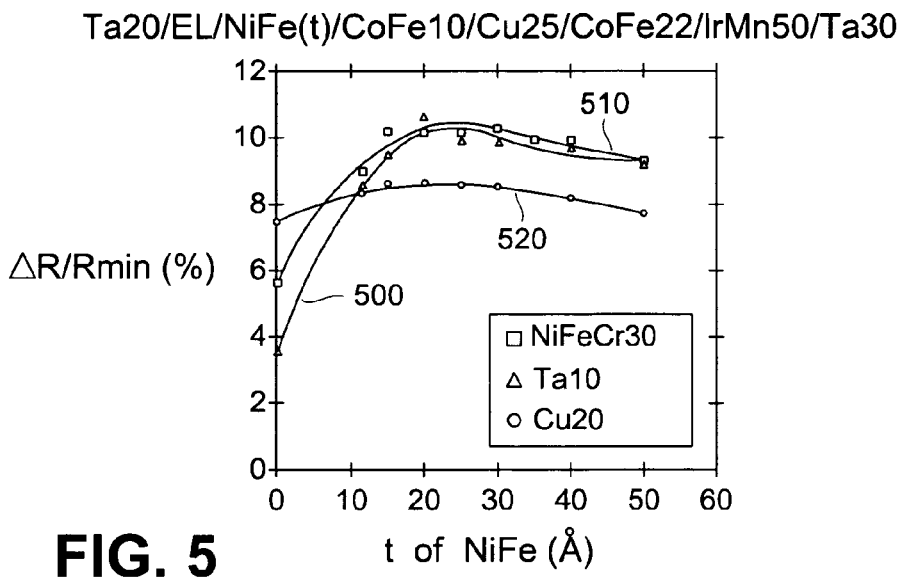
FIG. 5 is a graph of empirical data comparing ΔR/R verses the thickness of a NiFe in a NiFe/CoFe10 free layer for Cu20, NiFeCr30, and no enhancement layer in a top spin valve embodiment.
Figure 6:
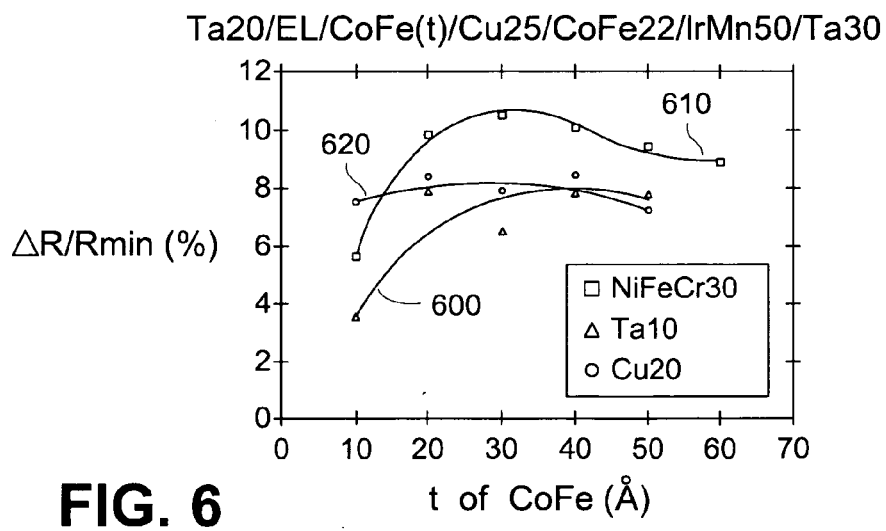
FIG. 6 is a graph of empirical data comparing ΔR/R Verses the thickness of a CoFe free layer for Cu20, NiFeCr30, and no enhancement layer in a top spin valve embodiment.

FIGS. 5 & 6 show the GMR effect ΔR/R for some top spin valve embodiments as the thickness of the free layer is varied. FIG. 5 illustrates empirical data from spin valve embodiments having a structure of Ta20/EL/NiFe(t)/CoFe 10/Cu25/CoFe22/IrMn50/Ta30, where: the number after the element or compound represents its thickness in Angstroms, EL is the enhancement layer as indicated by the separate curves, and (t) is the thickness of the NiFe portion of the free layer as shown along the x-axis of FIG. 5. FIG. 5 shows curves 500, 510, and 520 for spin valve embodiments with no enhancement layer, with a 30 Angstrom enhancement layer of NiFeCr, and with a 20 Angstrom enhancement layer of Cu, respectively.

FIG. 6 is a graphical representation of the GMR effect ΔR/R versus the thickness of a CoFe free layer. FIG. 6 illustrates empirical data from spin valve embodiments having a structure Ta20/EL/CoFe(t)/Cu25/CoFe22/IrMn50/Ta30, where: the number after the element or compound represents its thickness in Angstroms, EL is the enhancement layer, and (t) is the thickness of the CoFe free layer as shown along the x-axis of FIG. 6. FIG. 6 shows curves 600, 610, and 620 for spin valve embodiments with no enhancement layer, with a 30 Angstrom enhancement layer of NiFeCr, and with a 20 Angstrom enhancement layer of Cu, respectively.

Referring to FIGS. 5 & 6, in general, embodiments with the enhancement layer, as indicated by curves 510, 520, 610 & 620, show an improved GMR ratio over those without the enhancement layer 90, as indicated by curves 500 & 600, for free layer thicknesses below about 25 Angstroms. More specifically, as shown by curves 500 & 510 in FIG. 5, a 30 Angstrom NiFeCr enhancement layer improves the GMR ratio of a NiFe/CoFe10 free layer for thicknesses of NiFe below about 15 Angstroms. Referring to FIG. 6, a 30 Angstrom NiFeCr enhancement layer improves the GMR ratio of a CoFe free layer below about 50 Angstroms as shown by curves 600 & 610.

In some embodiments, operating parameters such as temperature may influence enhancement layer material selection. Thus, a material with higher thermal stability may be selected for enhancement layer 90. In the embodiment of FIG. 5 for example, NiFeCr may be selected, in part, because of its low interdiffusion rate with NiFe at higher temperatures, as discussed in the incorporated reference. Or, NiFeCr may be selected due to its favorable magnetostriction properties, also discussed in the incorporated reference.

Figure 7:
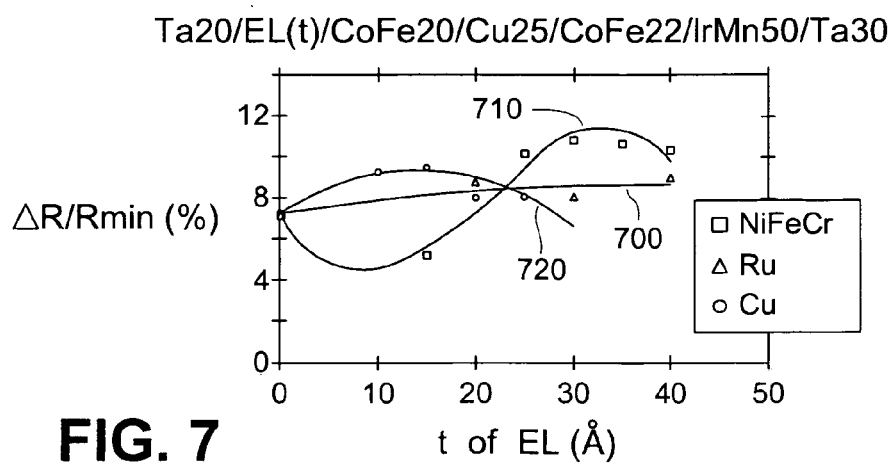
FIG. 7 is a graph of empirical data comparing ΔR/R verses the thickness of a NiFeCr, Cu, and Ru enhancement layers adjacent a CoFe20 free layer in a top spin valve embodiment.

FIG. 7 shows empirical data of the GMR effect ΔR/R versus the enhancement layer thickness for a few of the many possible enhancement layers. FIG. 7 illustrates the properties of spin valve embodiments having a structure of Ta20/EL(t)/CoFe20/Cu25/CoFe22/IrMn50/Ta30, where: the number after the element or compound represents its thickness in Angstroms, EL is the enhancement layer and (t) is its thickness as shown along the x-axis of FIG. 7. FIG. 7 shows curves 700, 710, and 720 for spin valve embodiments with enhancement layers of Ru, NiFeCr, and Cu, respectively. Such curves may be used in selecting the optimum thickness for a particular enhancement layer material/materials. For example, with the 20 Angstrom CoFe free layer of the embodiment of FIG. 7, about 15 Angstroms would provide the optimum thickness to maximize the GMR ratio using the Cu enhancement layer. Further, in this embodiment, about 35 Angstroms would provide optimum thickness to maximize the GMR ratio using the NiFeCr enhancement layer.

Referring to FIG. 7, it should be noted that as the optimum thickness for a particular enhancement layer material is surpassed, the GMR ratio begins to decline. This is assumed to be due to the competing shunting effect through the layer. Also in the spin valve embodiment of FIG. 7, NiFeCr provides a higher GMR ratio ΔR/R than Cu. Such disparity is assumed due to improved seed texture of the NiFeCr layer.

Table 1 below shows empirical data for several possible enhancement layer compositions in a top spin valve embodiment employing a 20 Angstrom CoFe free layer.

TABLE 1

Spin Valve Structure: Si/Ta20/EL/CoFe20/Cu/CoFe22/IrMn50/Ta30

| Enchancement Layer-EL (Angstroms) | Sheet Resistance $R_s$ (Ohm/sq) | GMR Ratio ΔR/R | ΔR (Ohm/sq) | Free Layer Coercivity $H_{cf}$ (Oe) |
|---|---|---|---|---|
| none | 26.23 | 7.7 | 1.87 | 15.84 |
| NiFeCr30 | 20.83 | 10.6 | 2.03 | 4.14 |
| Cu15 | 20.77 | 9.4 | 1.80 | 5.12 |
| Cu20 | 18.53 | 8.7 | 1.51 | 4.98 |
| Ru20 | 21.57 | 9.1 | 1.82 | 8.55 |
| NiFeCr30/Cu20 | 17.37 | 9.1 | 1.46 | 3.49 |
| Standard Spin Valve (no enhancement | 14.5 | 8.31 | 1.15 | 4.13 |

TABLE 1-continued

Spin Valve Structure: Si/Ta20/EL/CoFe20/Cu/CoFe22/IrMn50/Ta30

| Enchancement Layer-EL (Angstroms) | Sheet Resistance $R_s$ (Ohm/sq) | GMR Ratio $\Delta R/R$ | $\Delta R$ (Ohm/sq) | Free Layer Coercivity $H_{cf}$ (Oe) |
|---|---|---|---|---|
| layer, additional NiFe50 to form a NiFe50/CoFe20 free layer) | | | | |

As can be seen from Table 1, the use of the enhancing layer results in an improvement both in the GMR ratio and in the magnetic softness of the ultra thin CoFe free layer spin valve embodiment. These data show that the value of $\Delta R=2$ Ohm/sq. is easily obtainable with a structure and method of the present invention. In this case, however, the resistance of the film, approximately 20 Ohm/sq., is too high for some device applications. An $R_s$ of approximately 15 Ohm/sq. is desired in some embodiments due to electrostatic discharge concerns. Embodiments with lower $R_s$ still give improved performance over the standard spin-valve embodiment and still have the advantage of using the ultra thin CoFe free layer.

The standard spin valve typically uses NiFe to improve magnetic softness of the free layer, and Co or CoFe, which has a higher spin dependent scattering, to enhance the GMR signal. In some embodiments of the present invention, the enhancement layer serves to improve the soft properties of the CoFe free layer without using NiFe or other adjacent magnetic portions or layers. The use of the enhancement layer results in a significant softening of the free layer magnetic properties, with the coercivity of the free layer $H_{cf}$ being comparable to that of the standard spin-valve embodiment. In the preferred embodiments, the enhancement layer improves the soft properties of the CoFe free layer while inhibiting the drop in the GMR typically associated with an ultra thin free layer. In one of the preferred embodiments, represented in Table 1 above, the GMR ratio may be increased from about 7.7% without the enhancement layer to about 10.6% with a 30 Angstrom NiFeCr enhancement layer while the coercivity $H_{cf}$ of the CoFe free layer improves from 15.84 Oe without the enhancement layer to 4.14 Oe with the NiFeCr enhancement layer.

In the preferred top spin valve embodiments, the enhancement layer under the CoFe free layer acts to soften the free layer magnetic properties by inducing a desired texture in the CoFe. In addition, in the preferred top spin valve embodiment, the enhancement layer increases the GMR ratio by providing a conductive material adjacent the free layer so that the combined thickness of the free layer and enhancement layer is comparable to the electron mean free path. This increases the path difference between the spin up and down electrons, thus enhancing the GMR ratio.

Furthermore, in the above top spin valve embodiments, the enhancement layer does not exert an appreciable effect on the exchange field, with $H_{ex}$ being approximately 450 Oe for the above embodiments. This is true unless the enhancement layer changes the spin valve texture as disclosed in copending U.S. patent application Ser. No. 09/349,745, filed on Jul. 8, 1999, by Yiming Huai, entitled TOP SPIN VALVE WITH IMPROVED SEED LAYER, issued as U.S. Pat. No. 6,687,098, on Feb. 3, 2004, incorporated by reference.

In addition, in some embodiments, the enhancement layer has been observed to improve the squareness of the magnetization curve of the free layer.

In the preferred bottom spin valve embodiments, a NiFeCr seed layer may be used, as disclosed in U.S. patent application Ser. No. 09/221,799, filed Dec. 28, 1998 by Huai et al., entitled METHOD AND SYSTEM FOR PROVIDING AN IMPROVED ANTIFERROMAGNETIC LAYER OF BOTTOM AND DUAL SPIN VALVES, issued as U.S. Pat. No. 6,222,707, on Apr. 24, 2001, incorporated by reference, to promote the desired texture and magnetic performance in the antiferromagnetic layer. In bottom spin valve embodiments, the enhancement layer overlies the free layer so that the combined thickness of the free layer and enhancement layer is comparable to the electron mean free path to increase the path difference between the spin up and spin down electrons, thus enhancing the GMR ratio as discussed above.

Figure 8:
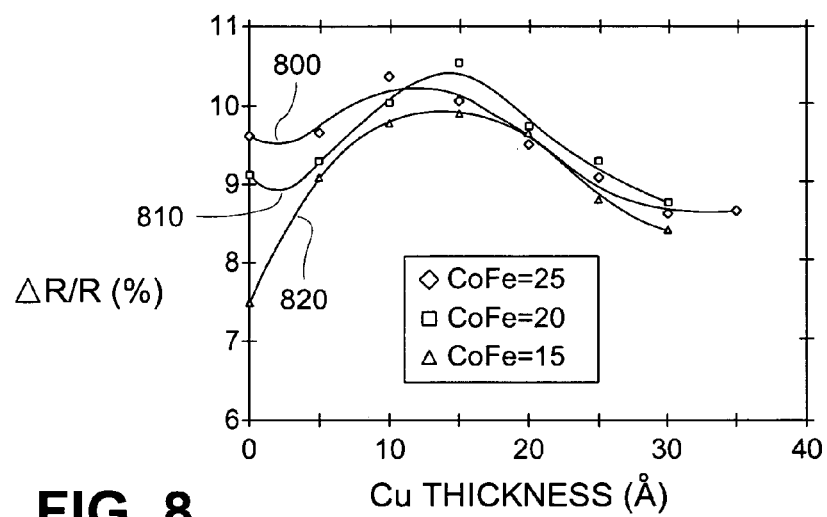
FIG. 8 is a graph of empirical data comparing ΔR/R verses the thickness of a Cu enhancement layer for CoFe15, CoFe20, and CoFe25 free layers in a bottom spin valve embodiment.

FIG. 8 shows the GMR effect $\Delta R/R$ for a bottom synthetic spin valve embodiment as the thickness of the Cu enhancing layer is varied. FIG. 8 illustrates empirical data from spin valve embodiments having a structure of Ta20/NiFeCr30/PtMn200/CoFe20/Ru8.5/CoFe25/Cu23/FL/Cu(t)/Ta30, where: the number after the element or compound represents its thickness in Angstroms, FL is the free layer as indicated by the separate curves, and t is the thickness of the Cu enhancement layer shown along the X-axis of FIG. 8. FIG. 8 shows curves 800, 810, and 820 for spin valve embodiments with a 25 Angstrom CoFe free layer, a 20 Angstrom CoFe free layer, and a 15 Angstrom CoFe free layer, respectively.

FIG. 8 shows an improved GMR ratio with the Cu enhancement layer, peaking at about 10–15 Angstroms for free layer thickness below about 25 Angstroms, and generally having greater improvement as the thickness of the free layer is reduced. As one example from FIG. 8, a 15 Angstrom Cu enhancement layer on a 15 Angstrom CoFe free layer provides about a 33% improvement, from about 7.5 to about 10, in $\Delta R/R$.

In such embodiments, Cu also provides high thermal stability because of its low interdiffusion rate with CoFe at higher temperatures.

The present invention is not limited to the above embodiments, it is expected that many other non-magnetic conductors will improve performance of spin valve embodiments as discussed above. For example, copper alloys and different antiferromagnet combinations are expected to provide increased $\Delta R/R$ and desirable $R_s$. As a further example, enhancement layers of CuNi, CuAg, CuAu, NiAu, NiAg, and their alloys are expected to improve spin valve performance. More generally, it is also expected that enhancement layers of Cu, Au, Ag, and their alloys will provide the beneficial results discussed above.

Furthermore, some embodiments may have a synthetic spin valve structure such as disclosed in U.S. Pat. No. 5,701,223, by Fontana, Jr. et al., issued on Dec. 23, 1997, entitled SPIN VALVE MAGNETORESISTIVE SENSOR WITH ANTIPARALLEL PINNED LAYER AND IMPROVED EXCHANGE BIAS LAYER, AND MAGNETIC RECORDING SYSTEM USING THE SENSOR; U.S. Pat. No. 5,465,185, by Heim, et al., issued on Nov. 7, 1995, entitled MAGNETORESISTIVE SPIN VALVE SENSOR WITH IMPROVED PINNED FERROMAGNETIC LAYER AND MAGNETIC RECORDING SYSTEM USING THE SENSOR; and U.S. patent application Ser. No. 09/135,939, filed on Aug. 18, 1998, by Yiming Huai and Marcos Lederman, issued as U.S. Pat. No. 6,175,476 titled SYNTHETIC SPIN-VALVE DEVICE HAVING HIGH RESISTIVITY ANTI PARALLEL COUPLING LAYER, on Jan. 16, 2001, all herein incorporated by reference in their entireties.

Figure 9:
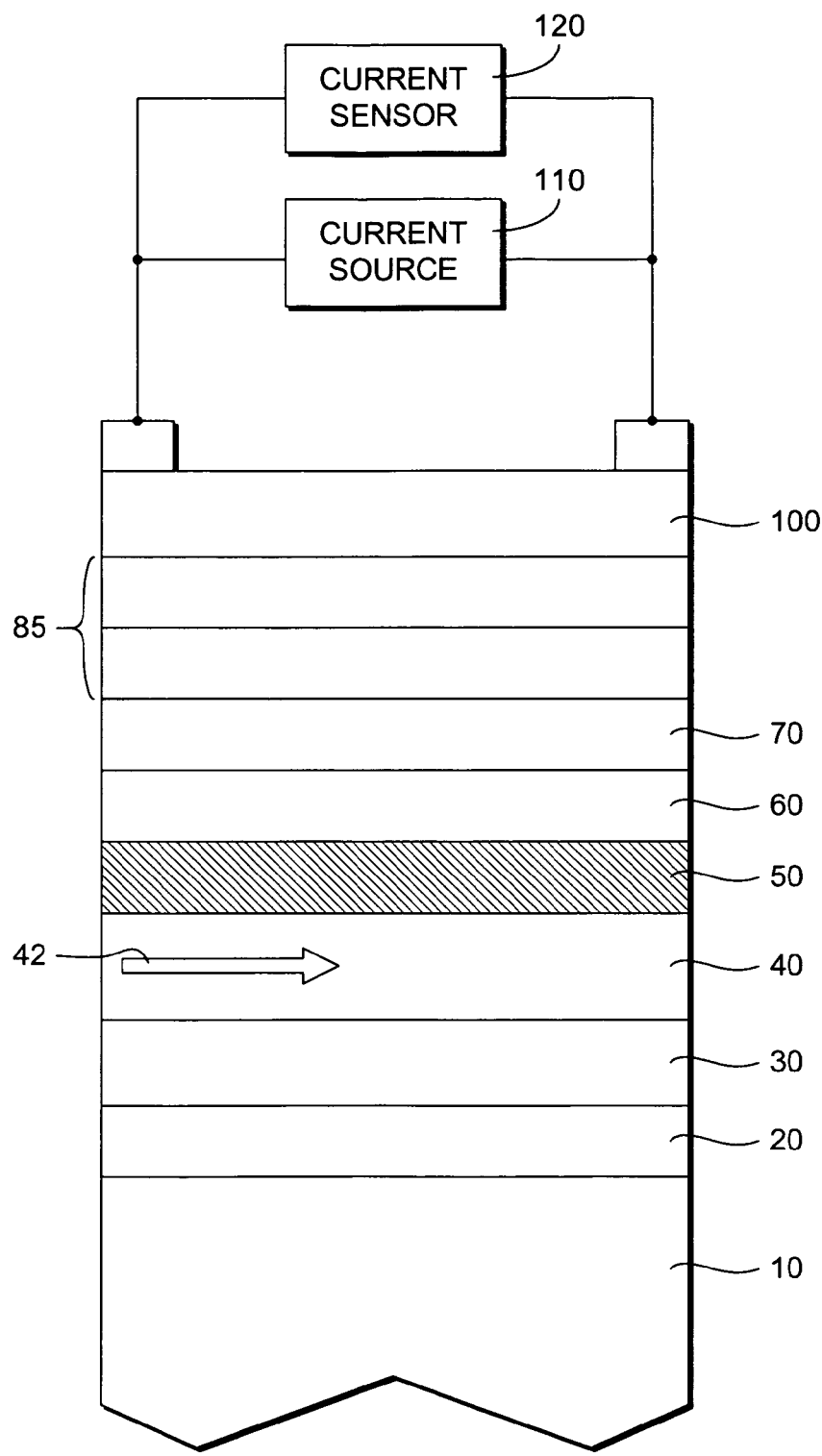
FIG. 9 is a cross-sectional view of a bottom synthetic spin valve sensor in accordance with the prior art.

For example, FIG. 9 shows a spin valve read sensor as disclosed in U.S. Pat. No. 6,175,476 that includes an antiparallel coupling layer 50, a second pinned layer 60, and a free layer 85. As in FIG. 3, FIG. 9 shows that the pinned layer 40 has a fixed magnetization in an orientation shown by arrow 42.

While the preferred embodiments of the present invention have been described in detail above, many changes to these embodiments may be made without departing from the true scope and teachings of the present invention. The present invention, therefore, is limited only as claimed below and the equivalents thereof.

What we claim is:

1. A spin valve sensor comprising:
   a) a first pinned layer;
   b) a free layer;
   c) a spacer layer located between the pinned layer and the free layer; and
   d) a non-magnetic enhancement layer immediately adjacent to the free layer, the enhancement layer comprising NiFeCr;
   wherein the free layer has a thickness in a range about 10 Angstroms to about 25 Angstroms.

2. The spin valve sensor of claim 1 wherein the free layer and the enhancement layer have a combined thickness equal to about a mean free path length of a conduction electron through the free layer.

3. The spin valve sensor of claim 1 wherein the free layer and the enhancement layer have a combined thickness within a range about 20 Angstroms to about 80 Angstroms.

4. The spin valve sensor of claim 1 wherein the enhancement layer further comprises at least one of Cu, Ru, or copper alloy.

5. The spin valve sensor of claim 1 wherein the free layer comprises at least one of NiFe, CoFe, Ni alloy, or Fe alloy.

6. The spin valve sensor of claim 5 wherein the enhancement layer further comprises at least one of Cu, Ru, or copper alloy.

7. The spin valve sensor of claim 6 wherein the enhancement layer comprises Cu and the free layer comprises CoFe, and wherein the layers are arranged in a bottom spin valve structure.

8. The spin valve sensor of claim 7 wherein the enhancement layer is about 10 Angstroms to about 20 Angstroms in thickness and the free layer is about 10 Angstroms to about 25 Angstroms in thickness.

9. The spin valve sensor of claim 6 wherein the free layer comprises about 20 Angstroms of CoFe, and the enhancement layer comprises about 30 Angstroms of NiFeCr in a top spin valve structure.

10. The spin valve sensor of claim 1 wherein the free layer consists of CoFe, and wherein the enhancement layer comprises a material capable of lowering the coercivity of the CoFe free layer.

11. The spin valve sensor of claim 1 further comprising a second pinned layer and an antiparallel coupling layer between the first pinned layer and the second pinned layer, wherein the spacer layer is between the second pinned layer and the free layer.

12. The spin valve sensor of claim 1 wherein the layers are arranged in a top spin valve structure, and wherein the enhancement layer comprises a material capable of providing good crystallographic texture to the free layer.

13. The spin valve sensor of claim 1 wherein the enhancement layer is a multi-layer structure comprising layers of NiFeCr and copper.

14. The spin valve sensor of claim 1 wherein the enhancement layer is a multi-layer structure comprising a NiFeCr layer having a thickness about 30 Å and a copper layer having a thickness of about 20 Å.

15. The spin valve sensor of claim 1, further comprising a seed layer.

16. The spin valve sensor of claim 1 wherein the non-magnetic enhancement layer comprises two or more layers.

* * * * *